United States Patent [19]

Brar et al.

[11] Patent Number: 5,156,919

[45] Date of Patent: Oct. 20, 1992

[54] FLUOROCARBON COATED MAGNESIUM ALLOY CARRIAGE AND METHOD OF COATING A MAGNESIUM ALLOY SHAPED PART

[75] Inventors: Amarjit S. Brar, Edina, Minn.; Prativadi B. Narayan, Bloomfield, Colo.

[73] Assignee: Segate Technology, Inc., Scotts Valley, Calif.

[21] Appl. No.: 504,344

[22] Filed: Apr. 3, 1990

[51] Int. Cl.$^5$ ........................................... B32B 15/08
[52] U.S. Cl. ........................ 428/463; 204/58.4; 204/192.12; 204/169; 204/170; 360/102; 360/106; 360/126; 427/490; 428/421; 428/938
[58] Field of Search ............... 428/621, 622, 625, 649, 428/900, 928, 938, 457, 461, 463, 421, 422; 427/34, 41; 204/58.4, 192.12, 192.16, 169, 170; 360/102–106, 126

[56] References Cited

U.S. PATENT DOCUMENTS

| 3,620,940 | 5/1970 | Wick | 204/58.4 |
|---|---|---|---|
| 4,188,426 | 2/1980 | Auerbach | 427/40 |
| 4,252,848 | 2/1981 | Datta et al. | 428/64 |
| 4,391,843 | 7/1983 | Kaganowicz et al. | 427/41 |
| 4,636,435 | 1/1987 | Yanagihara et al. | 428/336 |
| 4,668,347 | 5/1987 | Habermann et al. | 204/58.4 |
| 4,673,588 | 6/1987 | Bringmann et al. | 427/41 |
| 4,729,906 | 3/1988 | Kleeberg et al. | 427/41 |
| 4,863,809 | 9/1989 | Brar et al. | 428/623 |
| 4,941,062 | 7/1990 | Yoshioka | 360/106 |
| 5,017,439 | 5/1991 | Brar et al. | 428/629 |

OTHER PUBLICATIONS

J. P. Sharma, P. B. Narayan and A. S. Brar, "Gas Plasma Treatment of Sputtered Carbon Thin FIlm and Enhancement of its Properties," Northern Illinois University, Mechanical Engineering Dept., De Kalb, Ill. 60115.

*Primary Examiner*—Paul J. Thibodeau
*Assistant Examiner*—Hoa T. Le
*Attorney, Agent, or Firm*—Kinney & Lange

[57] ABSTRACT

A magnesium alloy structural member for supporting at least one actuator arm in a hard disk drive and a method for making a shaped magnesium part having a fluorocarbon coating is disclosed. The coating is applied by exposing the member to a reactive gas in the presence of a glow discharge plasma to prevent corrosion. The glow discharge is generated by providing a vacuum environment at a pressure of between 250 and 300 millitorr in a reaction chamber and applying power to a pair of electrodes contained within the reaction chamber. Power is supplied at between about 100 and about 200 watts at about 13.6 megahertz, forming a low temperature glow discharge plasma. A reactive gas comprising a fluorinated alkane is introduced to the reaction chamber, and a pressure of between about 100 and about 300 millitorr is maintained. The structural member is exposed to the reactive gas and the plasma for an amount of time sufficient to form a thin and uniform polymeric fluorocarbon coating on the surface of the part. After the coating is formed, the chamber is purged with a hydrocarbon gas to consume any fluorine free radicals.

31 Claims, 3 Drawing Sheets

FLUOROCARBON COATED MAGNESIUM ALLOY CARRIAGE AND METHOD OF COATING A MAGNESIUM ALLOY SHAPED PART

BACKGROUND OF THE INVENTION

The present invention relates to corrosion protection. In particular, it relates to corrosion protection of mechanical parts used in the manufacture of computer disk drives.

A computer hard disk drive typically has at least one disk having a magnetic recording surface, and a magnetic transducer for reading information from the disk and writing information onto the disk. When the disk drive is in operation, an air cushion forms between the disk and the transducer. Due to the air cushion, the transducer flies at a distance called "flying height" by computer component manufacturers. The flying height in a high performance disk drive is typically about 5 microinches to about 15 microinches (1,270-3,810 angstroms) above a spinning hard disk.

If any particulates come between the disk and transducer, the transducer may become aerodynamically unstable. This instability eventually leads to catastrophic head crash.

Repair of crashed hard drives at this time is not economical. A hard disk drive that has experienced a head crash must typically be replaced. Thus, it is essential to address all potential sources of contamination in a hard disk drive. For this reason, hard disk drive components are manufactured and assembled in a very clean environment, referred to as a "white room environment" to workers skilled in the art.

The materials used to construct individual parts of a hard disk drive may also contaminate the drive and cause head crash. Some metals used in forming mechanical parts corrode when exposed to the atmosphere. The corrosion generates particulates such as powder and flakes which break off and interfere with disk drive performance.

Anticorrosive coatings have been applied to the metal parts to inhibit corrosion. These coatings can flake or chip off and contaminate the disk drive. Coatings that are applied to parts to improve wear resistance and increase lubricity, for example, can also ultimately cause component failure if the coating flakes off.

It is essential to select materials in forming individual disk drive components which do not eventually contaminate the assembled hard disk drive.

High performance hard disk drives typically have a number of recording disks, and a number of actuator arms for supporting a number of magnetic read/write transducers near the disk surfaces. All of the actuator arms in the disk drive are supported by a single actuator arm carriage.

The carriage rapidly moves each actuator arm in unison during disk drive operation. Adequate mechanical performance of the carriage is heavily dependent upon the material selected to construct the part. The carriage must be constructed of a material that is rigid, is very light in weight, and has a high modulus of elasticity. Carriages known in the art are built of aluminum metal alloys, and magnesium metal alloys.

Aluminum alloys such as Alloy 356 (sand cast alloy) and Alloy 360 and 380 (die cast alloys) each have a suitable modulus of elasticity, (i.e.—between about 10.3 million and 10.5 million pounds per square inch) but have densities which provide excessive mass to the carriage/actuator arm assembly. Magnesium alloys such as Alloy AZ91B (die cast material), Alloy AZ91C (sand cast material) and AZ31B (wrought material) have a slightly lower modulus of elasticity (i.e.—about 6.5 million pounds per square inch) and are much less dense. A material having a modulus of elasticity of about 6.5 million p.s.i. is still suitable for forming a carriage.

It is estimated that carriages built of the magnesium alloys mentioned above have a mass which is about 65 percent of the weight of a 360 aluminum alloy, for example. A weight reduction of this magnitude allows the carriage/actuator assembly to accelerate much more rapidly, and provides more rapid operation of the hard disk drive. From the standpoint of its mechanical characteristics, the most preferred material for constructing actuator arm carriages is magnesium alloy AZ91B. Alloy AZ91B contains aluminum in an amount of about 9 percent by weight, zinc in an amount of about 1 percent by weight, and manganese in an amount of about 0.2 percent by weight. The balance is magnesium.

Although magnesium alloy AZ91B exhibits superior mechanical characteristics, it is highly reactive with atmospheric constituents. Atmospheric constituents such as oxygen, moisture and chlorine are known to react with the alloy. In particular, AZ91B alloy rapidly corrodes in the presence of oxygen and moisture. Magnesium also reacts with chlorine present in the air, forming magnesium chloride. Corrosion products, such as magnesium oxide and magnesium chloride, for example, flake off and form particulates which are known to cause head crashes.

In order to take advantage of the superior mechanical characteristics of magnesium alloys, it is necessary to treat the surface of the carriage with an anticorrosive coating to prevent the formation of corrosion products. Various anticorrosive coatings have been applied to the exterior surfaces of the carriage. Presently, a Parylene-C coating is used as a corrosion inhibiter for alloy AZ91B. Parylene-C is available from the Nova Tran Corporation of Clear Lake, Wis. Parylene-C coating has the following chemical structure:

Although Parylene-C coating is known to initially inhibit corrosion, it has recently been discovered that in as little as one year after coating, severe corrosion of the exterior surfaces of the carriage is present. Anticorrosive coatings must be effective for the life of the disk drive.

Parylene-C has a chlorine atom attached to the aromatic ring which reacts with the magnesium in the alloy, causing corrosion. The primary substance which causes hard disk drive contamination in Parylene-C coated magnesium alloy carriages is magnesium chloride.

If corrosion of any type is discovered before the disk drive component containing the carriage is shipped to a customer, the disk drive component must be disassembled, and the carriage recoated. This procedure is undesirable because the labor costs involved are high, and recoating the carriage is expensive and time consuming. If the disk drive has already been shipped, or put into use, corrosion on the surfaces of the carriage is even more undesirable.

An adequate anticorrosive coating should be thick enough to prevent corrosion, but thin enough to avoid interfering with the conductive properties of the substrate. At thicknesses between about ½ mil and about 1 mil (127,000 to 254,000 Angstroms), Parylene-C coatings failed to prevent corrosion in a period of time of less than one year. Because the useful life of a disk drive often exceeds one year, Parylene-C coating has proved to provide an unacceptable corrosion barrier.

Parylene-C coatings at thicknesses of between about ½ mil to about 1 mil (127,000–254,000 angstroms) are also known to interfere with the conductive properties of the metal. At thicknesses within this range, the magnesium alloy substrate is less electrically conductive, and is not as capable of dissipating static as the substrate would be without the coating. Components which are not static dissipative are known to arc when subjected to a static charge. Arcing is known to damage the electrical components of the disk drive. The loss of conductivity also causes the substrate to attract particulates such as dust, which cause hard drive crashes.

Other organic coatings have been applied by various methods, such as electrostatic dipping for example, but have produced coatings which are generally too thick, and which vary greatly in thickness across the exterior surfaces of the part. These coatings also are of a thickness which interferes with the electrical properties of the substrate. For example, E-Coating, an epoxy product available from the Glidden Paint, Architectural Maintenance Company, Dublin, Ohio, is applied to carriages by an electrostatic method. E-Coating is generally too thick, and provides a coating which does not have a uniform thickness. Coatings which are too thick or which vary in thickness interfere with the close tolerances required in manufacturing the carriage. Typically the machined portions of the carriage require tolerances of plus or minus 0.003 inch.

Actuator arm carriages are formed by several methods. The carriages may be die cast, sand cast, or machined from wrought alloy. Die casting is the most desirable because the outer surfaces of the part are smoother, and require less machining to manufacture the finished part. Machining a part from wrought alloy is the least desirable because the procedure is time consuming and expensive. Sand casting is an acceptable method, but produces a part having exterior surfaces which are more rough than surfaces formed from a die cast method. The rougher surfaces require more machining, and are more costly to manufacture.

Machining magnesium metal, or magnesium metal alloys, requires an oxygen-free environment to avoid explosions. Also, because the metal is very hard, machining the carriages requires the use of very hard cutting tools.

After machining, the carriages are inspected for signs of corrosion, cleaned and coated with an anticorrosive coating. None of the anticorrosive coatings known in the art adequately prevent corrosion of the magnesium alloy carriage. None of the existing coatings are thin enough to avoid interfering with the close machine tolerances required in the manufacture of the part. None of the existing coatings are thin enough to avoid significantly diminishing the electrostatic properties of the metal. The prior art coatings also do not provide corrosion protection for the entire expected life of the hard disk drive.

SUMMARY OF THE INVENTION

The present invention is a mechanical part for use in a computer hard disk drive. The part is formed from a lightweight magnesium alloy that is substantially rigid, and is coated with a thin fluorocarbon coating which prevents corrosion of the exterior surfaces of the part. A mechanical part to which the present invention specifically relates is an actuator arm carriage which supports at least one actuator arm, and attached magnetic read/write (or servo) transducer.

The hard disk drive which incorporates an actuator arm carriage in accordance with the present invention includes a plurality of magnetic recording disks, and a plurality of magnetic transducers. The magnetic transducers cooperate with a magnetic disk surface, and read data from or write data on the disk surface. The carriage moves each actuator arm in unison which in turn moves each transducer from position to position on the disk surface.

The carriage of the preferred embodiment is formed of a very lightweight alloy including magnesium as the principal component. The alloy is very light in weight and has a modulus of elasticity between about 6.0 million and about 12.0 million p.s.i. The mechanical characteristics of the magnesium alloy allow the carriage/actuator arm assembly to rapidly accelerate, and quickly access data.

Magnesium is known to be very reactive with substances present in the atmosphere. The exposed surfaces of the carriage of the present invention are coated with an anticorrosive fluorocarbon polymer coating having a uniform thickness of between about 50 and about 500 angstroms. The thickness of the coating depends in part upon the surface roughness of the substrate.

The present invention also includes a method of forming a fluorocarbon coating on a magnesium alloy part. The coating is formed by placing a magnesium alloy substrate in a reaction chamber, providing a vacuum atmosphere of between about $1 \times 10^{-6}$ and about $1 \times 10^{-4}$ torr, and introducing an amount of argon gas sufficient to raise the pressure to about 250–300 millitorr. Power is provided to a pair of electrodes positioned in the reaction chamber at between about 100 and about 200 watts, at about 13.6 megahertz, forming a glow discharge plasma. The flow of argon gas is shut off. Then, a reactive gas comprising a fluorinated alkane is introduced into the reaction chamber. The most preferred reactive gas is carbon tetrafluoride. An amount of reactive gas sufficient to maintain the pressure in the reaction chamber at between about 100 and about 300 millitorr is introduced into the chamber. The substrate is exposed to the reactive gas and the glow discharge plasma for an amount of time sufficient to form a very thin fluoropolymer coating on the surfaces of the substrate. Following the exposure of the part to the reactive gas, the reaction chamber is flushed with a purge gas comprising a gaseous hydrocarbon for an amount of time sufficient to form a substantially nonreactive outer surface on the fluorocarbon coating.

DETAILED DESCRIPTION OF THE PREFERRED EMBODIMENTS

The present invention provides an actuator arm carriage formed from a magnesium metal alloy for use in a hard disk drive of a computer. The outer surfaces of the carriage are coated with fluorinated polymer. The present invention also includes a method of applying a fluorocarbon coating to a substrate formed from a magnesium alloy. A "magnesium alloy" for purposes of this disclosure is a substantially solid mixture of metals comprising greater than 50 percent magnesium metal.

Figure 1:
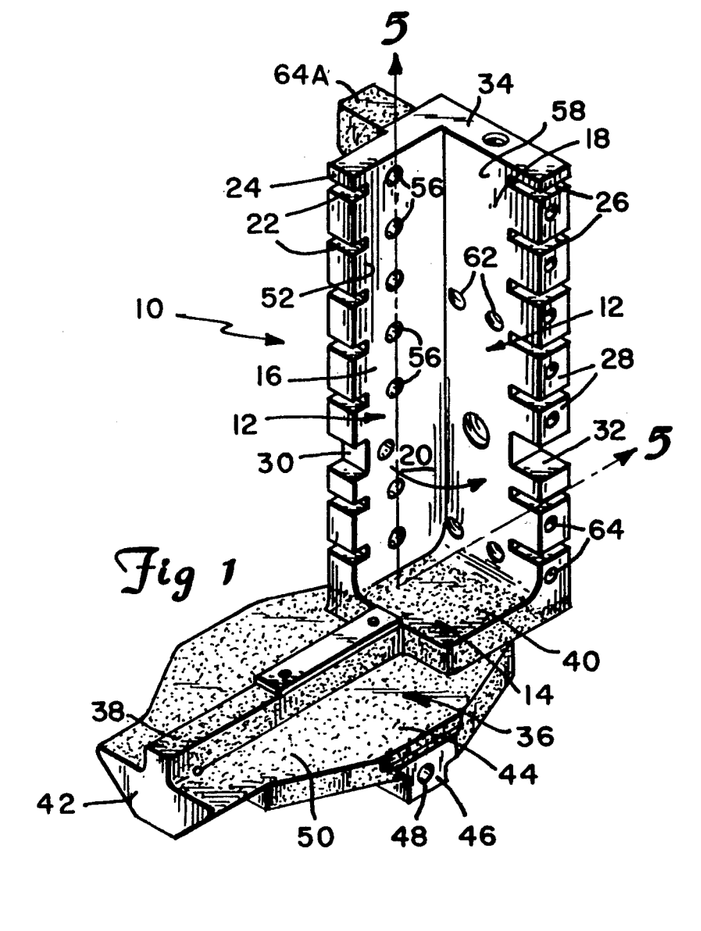
FIG. 1 is a first perspective view of an actuator arm carriage in accordance with the present invention.

FIG. 1 illustrates an actuator arm carriage 10 in accordance with the present invention. The carriage 10 is used to support a plurality of actuator arms (not shown) in a position which is substantially parallel to a plurality of hard disk surfaces in a disk drive (not shown).

In the preferred embodiment, the carriage 10 is formed from magnesium alloy AZ91B (die cast alloy). AZ91B Alloy contains aluminum in an amount of about 9 percent by weight, zinc in an amount of about 1 percent by weight, and manganese in an amount of about 0.2 percent by weight. The balance is magnesium. Magnesium alloy AZ91B is the most preferred material for forming the actuator arm carriage 10 because the material is extremely light in weight, and has a high modulus of elasticity. The reduced weight minimizes the inertia of the carriage/actuator arm assembly while the disk drive is in operation. A high modulus of elasticity allows the carriage to rapidly return to its original shape after deflection.

Alloys in accordance with the present invention are selected based on the density of the metal, and the modulus of elasticity. Magnesium is a metal which has a density which is approximately 65 percent of the density of aluminum. A modulus of elasticity between about 6.0 million and about 12.0 million pounds per square inch (psi) is a suitable performance characteristic for a material used to form an actuator arm carriage. The most preferred magnesium alloy, AZ91B has a modulus of elasticity of about 6.5 million psi.

Magnesium alloys have the added advantage of being electrically conductive.

Although a magnesium alloy containing small amounts of zinc and aluminum form the most preferred carriage 10, other magnesium-containing metals such as Alloy AZ31 having a modulus of elasticity in the range of about 6.0 million psi to about 12.0 million psi are suitable materials for forming the carriage 10.

The carriage 10, formed in accordance with the most preferred embodiment, is formed by a die cast method, and is then machined to very small dimensional tolerances. The illustrated carriage 10 is machined to a tolerance of about +/−0.003 inch in each direction. The precise dimensions of the carriage 10 are dependent upon the size and characteristics of the disk drive, and are not critical to the present invention. In accordance with a second preferred embodiment, the carriage 10 is sand cast. A carriage 10 formed by either die casting or sand casting has smooth machined surfaces (surface 12, for example), and more rough cast surfaces (surface 14, for example).

The parts are machined in an oxygen-free environment to prevent sparking or explosions. Because magnesium alloys are very hard, it is necessary to select tooling machinery which is capable of cutting magnesium.

In the illustrated embodiment, the carriage 10 includes first and second substantially flat vertical members 16 and 18 intersecting at an angle 20 of about ninety degrees. The vertical members 16 and 18 form an inner corner for receiving a substantially rectangular edge portion of an actuator arm (not shown). The overall height of the carriage 10 measured along an edge 24 of the first vertical member 16 is about 3½ inches. The width of each vertical member 16 and 18 is about ⅜ of an inch, measured along the front surfaces 52 and 58. A plurality of small notches 22 are cut horizontally into an edge 24 of the first vertical member 16, and a plurality of small notches 26 are cut horizontally into the edge 28 of the second vertical member 18. In the preferred embodiment, seven notches 22 having a depth (measured horizontally in FIG. 1) of about 3/16 of an inch, and having a width (measured vertically in FIG. 1) of about 1/16 inch are cut into the first vertical member 16, and seven notches 28 of substantially the same size as the notches 22 are cut into the second vertical member 18.

The first vertical member 16 also has a larger notch 30 having a depth of about 3/16 and a width of about ¼ inch cut into the edge 24, proximate the center of the vertical member 16. The second vertical member 18 also has a larger notch 32 cut into the edge 28 of substantially the same size as notch 30, and which is positioned vertically the same distance from the upper edge 34 of the carriage 10 as the distance from the notch 30 to the top edge 34.

The carriage 10 has a base member 36 which has 10 a cast finish. The base member 36 has a machined central rail 38 extending from the base of a raised, substantially square platform 40 formed by the intersection of horizontal members 16 and 18, to the end 42 opposite the platform 40. The upper surface of the platform 40 has a cast finish, and the rail 38 is about 2 inches in length.

The base member 36 has a central portion 44 which is wider than the width of the base near the end 42 or near the platform 40. The central portion 44 has a side edge 46 which is machined and has a cylindrical shaped aperture 48 extending from the side edge 46 into a portion of the base member 36.

The cast surfaces 50 of the base member 36 are die cast and are rough compared to the roughness of the machined surfaces 38 and 46, for example.

The front surface 52, a portion of the back surface 54 (shown in FIG. 2), the top edge 34 and the side edge 24 of the first vertical member 16 are substantially flat machined surfaces. A plurality of apertures 56 extend through the first vertical member 16, intersecting the front surface 52 and back surface 54 (shown in FIG. 2). There are eight apertures 56 in the example shown in FIG. 2. Each aperture 56 is of the same size (about ⅛ inch), and has an inner surface which is substantially cylindrical and smooth.

The second vertical member 18 also has a machined front surface 58, a machined rear surface 60 (shown in FIG. 2), and a plurality of apertures 62 extending through surfaces 58 and 60. There are five apertures 62 in the embodiment shown in FIG. 2, each having a threaded interior surface. One aperture in the preferred embodiment is located centrally on the second vertical member 18 and is about ¼ inch inner diameter in size. The remaining apertures 62 are spaced around the larger aperture and have openings of about 3/32 of an inch.

Figure 2:
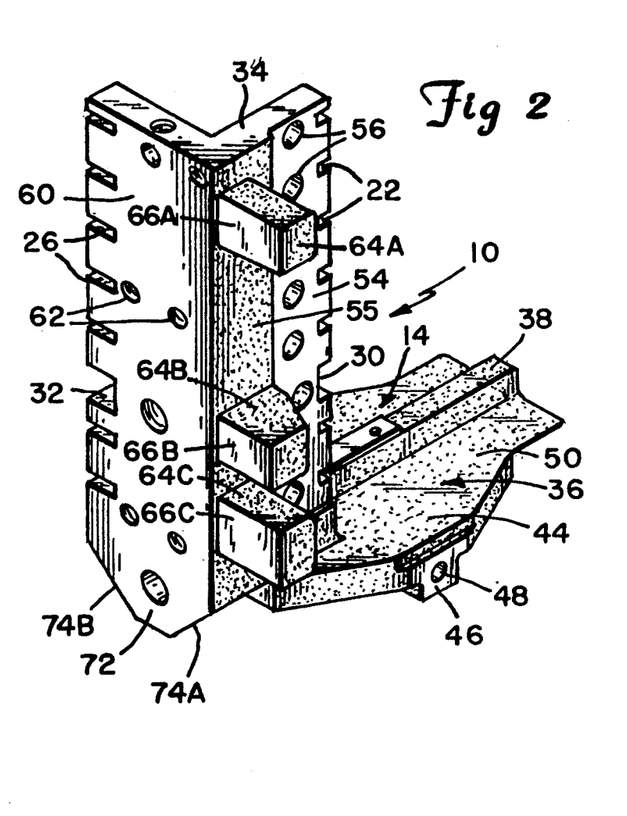
FIG. 2 is a rotated perspective view of the actuator arm carriage of FIG. 1.

The side edge 28 of the vertical member 16 is cut into substantially rectangular surfaces, most of which have a plurality of threaded apertures 64 extending into a portion of the second vertical member 18. In the preferred embodiment, there are seven apertures 64 of about a 1/32 inner diameter in size.

FIG. 2 is a second perspective view of the carriage 10 as viewed from a direction 180 degrees from the view illustrated in FIG. 1. There are three projections 64A, 64B and 64C extending outwardly from surface 55. The surfaces 66A, 66B and 66C are substantially parallel to the surface 60 in the preferred embodiment and are machined. The rest of the surfaces of the projections 64A, 64B and 64C have a cast finish.

Figure 3:
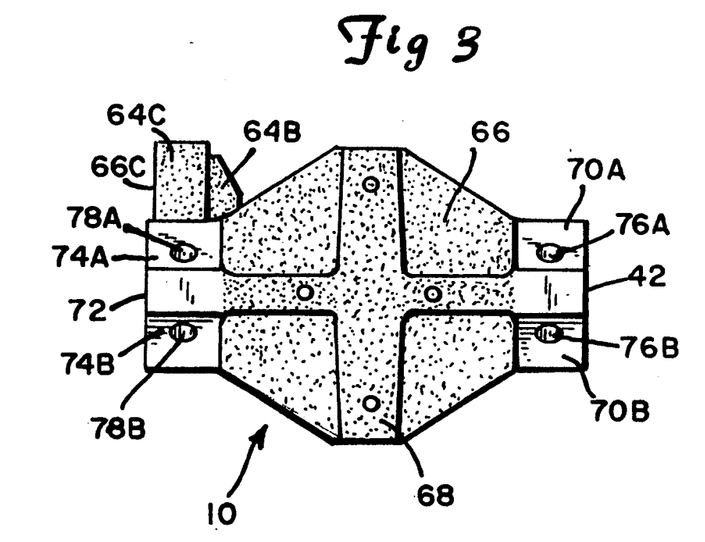
FIG. 3 is a bottom plan view of the actuator arm carriage of FIGS. 1 and 2.

FIG. 3 is a bottom plan view of the carriage 10. The carriage 10 has a lower cast finished surface 66 and a raised machined surface 68 defining the lowermost portion of the carriage. Near the end 42 are a pair of machined tapered surfaces 70A and 70B which intersect the raised machine surface 68. At the end 72 opposite the end 42 are a second pair of tapered machined surfaces 74A and 74B. Intersecting each tapered surface 70A, 70B, 74A, and 74B in the preferred embodiment are cylindrical apertures 76A, 76B, and 78A, and 78B, each having an axis which is substantially perpendicular to the tapered surfaces 70A, 70B, 74A, and 74B, respectively. In the preferred embodiment, the cylindrical apertures 76A, 76B, 78A, and 78B have smooth inner surfaces.

The carriages 10 are cast, machined, and then coated with conventional machine oil to prevent corrosion of the exposed surfaces. The machine oil remains on the outer surfaces of the carriages 10 until shortly before applying the fluorocarbon coating of the present invention. Because the machine oil does not completely prevent corrosion, the preferred method of forming a coated carriage 10 includes minimizing the amount of time which elapses between machining and coating. The time between machining and coating according to the preferred method is no greater than eight hours.

Immediately before applying the fluorocarbon coating of the present invention, the carriages 10 are cleaned in an ultrasonic bath containing Freon TMS, a solvent available from the E. I. Du Pont de Nemours, Co. of Wilmington, Del., or in a suitable equivalent such as Freon TF (also available from Du Pont), for example. The solvent must be capable of dissolving machine oil and organic contaminants. The carriages 10 are cleaned for a period of at least five minutes up to several hours to remove all but a trace amount of machine oil. The preferred cleaning time is about five minutes. The carriages 10 are then quickly dried in a conventional manner, such as in an inert nitrogen environment to prevent oxidation.

The carriages 10 are next inspected for signs of corrosion. Any black, gray or white streaking on the surfaces of the carriage 10 indicates that corrosion has occurred. It is necessary to remove this corrosion before applying the coating of the present invention to obtain adequate adherence of the coating to the metal surfaces. The preferred method of cleaning the corroded surfaces is by exposing the carriage 10 to a low temperature plasma according to the method which is described below.

Figure 4:
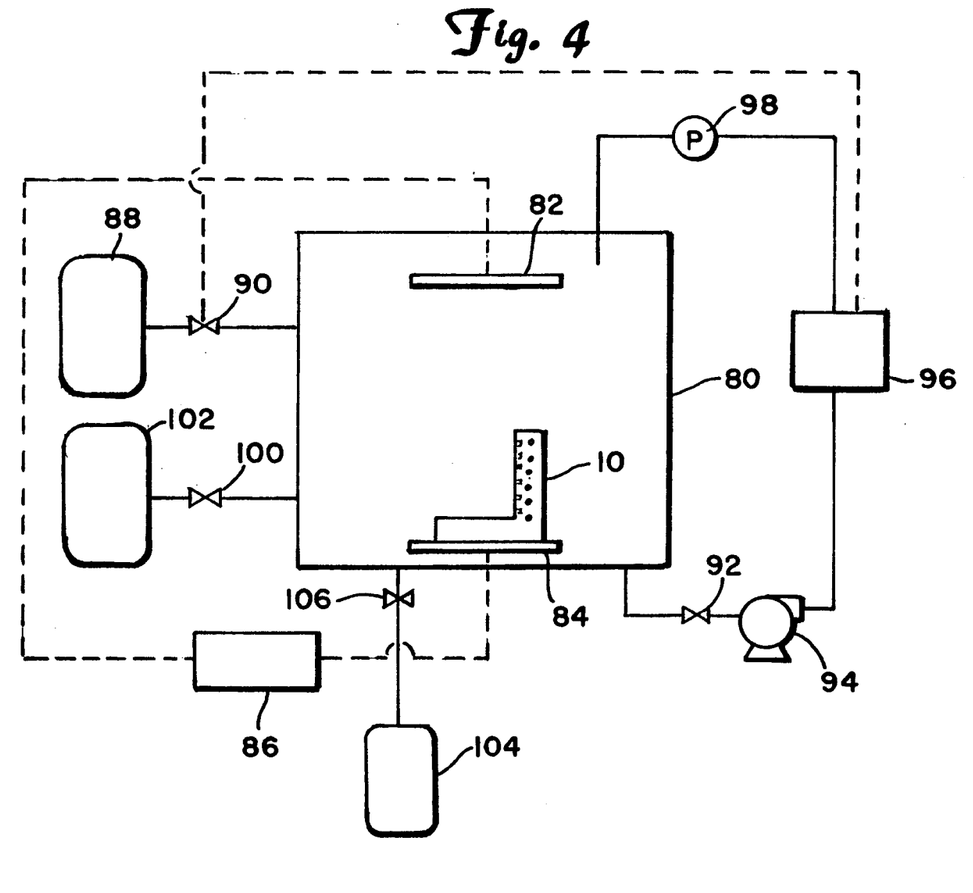
FIG. 4 is a schematic diagram of an apparatus for carrying out the coating method of the present invention.

A schematic diagram of the apparatus for carrying out the method of the present invention is illustrated in FIG. 4. The apparatus includes a reaction chamber 80 which is large enough to contain at least one substrate to be coated. Although the present method is not limited to coating a carriage 10, the carriage 10 is one example of a shaped mechanical part. The chamber according to the preferred method is about $12'' \times 12'' \times 12''$, and large enough to contain only one carriage 10. The present method may be carried out in any size chamber with any number of shaped parts which can be positioned in the reaction chamber. Within the reaction chamber 80 are a pair of electrodes 82 (anode) and 84 (cathode) for generating an electrical field in the reaction chamber 80.

A power supply 86 in the preferred embodiment is electrically connected to each electrode 82 and 84, and provides between about 100 and about 200 watts power to the electrodes 82 and 84. The most preferred power is supplied at about 150 watts. The power supply in the preferred embodiment is A.C., and is within the Radio Frequency (RF) range. The most preferred frequency is 13.6 megahertz. The carriage contacts the electrode 84 according to the most preferred method. This method is referred to as "inductive coupling", and is suitable for use with substrates which are electrically conductive. The carriage 10 is also positionable between electrodes 82 and 84, in a manner which is out of electrical contact with electrodes 82 or 84. This method is referred to as a "free floating" method. To obtain an electrical field of an intensity strong enough to carry out the present reaction by the free floating method, it is necessary to provide more power to the electrodes 82 and 84, such as 200 watts, for example. The present invention also contemplates alternative methods for generating an electrical field within the reaction chamber 80 such as by providing a coil around the exterior of the reaction chamber 80 (not shown).

If the substrate shows signs of corrosion, the carriage 10 is pretreated in the chamber by a "plasma etch" method to remove any deposits which may interfere with adhesion between the substrate surface and the anticorrosive coating of the present invention.

The plasma etch method includes a first step of flushing the reaction chamber 80 with argon gas supplied to the chamber 80 from a bottle 88 which is fluidly connected to the chamber 80. A valve 90 is opened, allowing argon to enter the chamber. An outlet valve 92 is also opened to allow the flush gas to escape. An amount of gas equal to at least six volumes of the reaction chamber 80 at standard conditions (S.T.P.) passes through the apparatus. Any amount of gas sufficient to eliminate the oxygen in the chamber 80 is adequate for flushing the chamber.

Then, the argon gas valve 90 is closed. A vacuum pump 94 cooperates with a pressure controller 96 and a pressure sensor 98, and lowers the pressure in the reaction chamber 80 to between about $1 \times 10^{-6}$ and about $1 \times 10^{-4}$ torr. The controller 96 is electrically connected to an actuator on the argon valve 90, and allows additional argon to enter the chamber 80 to maintain a pressure within the selected range.

Power between about 100 and about 200 Watts, with a preferred power of about 150 watts, at a frequency of about 13.6 megahertz (RF frequency) is applied to the cathode 84, forming a glow discharge plasma between the cathode 84 and the anode 82. Both the cathode 84 and the anode 82 are positioned within the chamber 80 according to the preferred method. The carriage 10 in the preferred method contacts the cathode 84, and is inductively coupled to the cathode 84. The carriage 10 remains in the plasma for a period of between about 45 minutes to about 2 hours. The most preferred exposure time is about one hour. Exposure times within the stated time range remove substantially all of the oxidized metals, other corrosion products and a majority of other surface contaminants. Although argon is the most preferred gas, nitrogen gas may alternatively be used to plasma etch the substrate.

Although not critical to the present invention, the substrate (carriage 10) according to the present method during the "plasma etch" step does not exceed a temperature of about 100 degrees Centigrade at about 150 watts, and at about 13.6 megahertz frequency.

If the carriage shows no visible signs of corrosion, the "plasma etch" step may be skipped. Instead, the outlet valve 92 is opened, the argon supply valve 90 is closed, (the reactive gas valve 100 is also closed) and a vacuum pump 94 evacuates the chamber 80 until the pressure sensor 98 indicates to the controller 96 that a vacuum is present in the chamber in a preselected range of between about $1 \times 10^{-4}$ and about $1 \times 10^{-6}$ torr.

After either plasma etching, or pulling a vacuum between $1 \times 10^{-4}$ and $1 \times 10^{-6}$ torr, the pressure controller 96 is reset to a pressure range of between about 250 and 350 millitorr. The controller 96 opens the argon supply valve 90, allowing argon gas stored in the bottle 88 to fill the reaction chamber 80, until the chamber 80 reaches the selected pressure.

The argon supply valve 90 is closed, and the pressure controller 96 is reset to a selected pressure range of between about 100 to about 300 millitorr. A bottle of reactive gas 102 is fluidly connected to the reaction chamber 80. Reactive gas for purposes of this disclosure is a gas which reacts chemically on the surface of the substrate, forming a coating. The reactive gas supply valve 100 is opened, and reactive gas enters the reaction chamber 80 until the pressure sensor 98 in the reaction chamber 80 senses the selected pressure. The most preferred pressure for this step is about 250 millitorr. The anode 82 and cathode 84 remain energized while the reactive gas enters the reaction chamber 80.

The argon supply valve 90 according to the preferred method remains closed during the reaction. There is still an amount of unreactive argon gas present in the reaction chamber 80 during the coating process. Although the presence of argon is not critical to forming the fluorocarbon coating, it is believed that the large argon molecules bombard the surfaces of the carriage 10, heating the substrate to a temperature of about 100 degrees C which tends to drive the chemical reaction on the surface of the carriage 10 toward completion (polymerization). Any amount of argon up to about five mole percent enhances the polymerization. Alternatively, the reaction chamber 80 can be evacuated to between about $1 \times 10^{-6}$ and about $1 \times 10^{-4}$ torr and then filled with 100 percent reactive gas. The absence of the argon does not prevent the formation of a glow discharge plasma, or the commencement of the polymerization reaction.

The reactive gas used according to the present method is selected from the group comprising fluorinated alkanes. The most preferred reactive gas is carbon tetrafluoride. Carbon tetrafluoride in the presence of the plasma tends to lose at least one or two fluorine atoms, and is believed to form $CF_3+$ reactive species, as well as $CF_2 3O+$ reactive species. Excess fluorine ions are a by-product of the polymerization.

Although the reaction mechanisms in forming the coating of the present invention are not precisely understood, it is believed that in order to initiate the polymerization, it is necessary to have a number of reactive carbon species present on the surface of the substrate. Surface contamination of the substrate from exposure to air, and residue from the machine oil earlier removed may provide a sufficient amount of reactive carbon on the surface of the substrate to commence the polymerization reaction. The first amounts of reactive gas introduced into the reaction chamber 80 may also provide a sufficient amount of reactive carbon species for initiating the polymerization reaction.

In the most preferred embodiment, an extended chain, fully saturated hydrocarbon having essentially the following formula forms on the surface of the substrate:

The reaction of the preferred method is believed to form a tough, corrosion resistant coating which comprises essentially polymerized carbon and fluorine atoms. The composition of the coating of the preferred embodiment was verified by Electron Spectroscopy for Chemical Analysis (ESCA) techniques known in the art. The gas which exits the reaction chamber 80 is rich in fluorine gas.

Although the exact mechanism of the reaction is not precisely understood, it is believed that the polymerization occurs completely on the surface of the substrate, and that the polymer becomes chemically bonded to the surface. The bonding of the metals in the selected magnesium alloy to the reactive species is believed to be one of the reasons why the coating of the present invention has superior corrosion resistance.

Although $CF_4$ is the most preferred reactive gas for use with the present method, many other reactive gasses, including gas mixtures form suitable fluorocarbon coatings. $C_2H_6$, $C_3H_8$, $CHF_3$, $CF_3$, $F_2$ and $CHCF_3$, for example, which are formed primarily from carbon and-/or fluorine are suitable reactive gasses. Also, mixtures of two or more of the above mentioned gasses also form a suitable reactive gas. For example, a mixture of $CF_4$ and fluorine gas produces a coating of essentially the same composition as shown by the reaction, above.

When selecting the reactive gas, it is critical to maintain the atomic ratio of carbon atoms to fluorine atoms at or below about 1:2. By maintaining the carbon to fluorine ratio at or below 1:2, a fully saturated polymer having the structure shown above is formed. Maintaining a C:F ratio in the gas which is less than or equal to the C:F ratio in the desired polymer drives the reaction in the direction of saturating the polymer with fluorine atoms.

The substrate 10 is exposed to the glow discharge plasma and the reactive gas for a period of about 45 minutes to about 2 hours. Because the process of forming this coating is a vapor deposition method, a coating having a substantially uniform thickness is formed. The most preferred exposure time is about 60 minutes. Exposures within the stated range produce coatings having a thickness of between about 50 and about 500 angstroms. Fluorocarbon coatings having thicknesses between about 50 and about 500 angstroms do not significantly change the electrical conductivity of the substrate, and do not cause the shaped part to attract particulates. Mechanical parts having dimensional tolerances of about +/−0.003 inch are not changed enough by applying coatings having a thickness between about 50 and about 500 angstroms to cause quality control rejections due to size.

Figure 5:
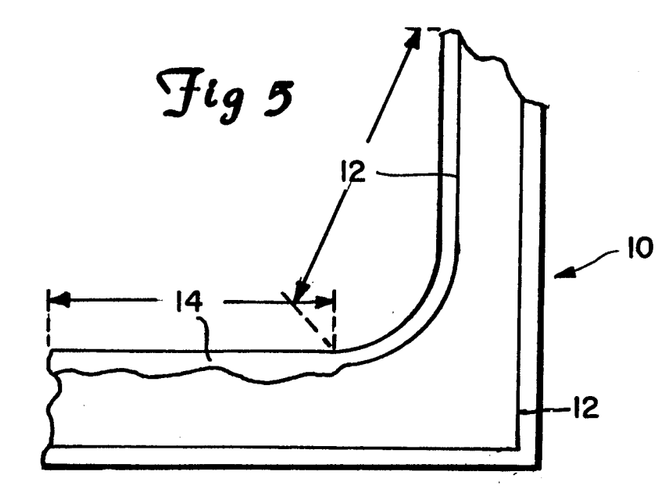
FIG. 5 is a cross-sectional view of an actuator arm carriage, taken along line 5—5 in FIG. 1.

FIG. 5 shows a cross-sectional view of the carriage 10 after the coating step taken along line 5—5 in FIG. 1. The rough cast surfaces 14, as well as the machined surfaces 12 are coated with a substantially uniform fluoropolymer coating having a thickness between about 50 and about 500 angstroms, with a preferred thickness of about 100 angstroms.

It was surprisingly discovered that a polymer formed on the surface of a magnesium alloy according to the method described above is highly reactive. In particular, the coating readily absorbs water which causes corrosion in the underlying metal. In order to eliminate the surface reactivity, the present method includes a final step of purging the reaction chamber 80 as shown in FIG. 4 with a purge gas containing a hydrocarbon, such as methane. Other gasses such as ethane, propane and butane, for example, also are suitable purge gasses. The purge gas may also be a mixture of a hydrocarbon and an inert gas such as argon or nitrogen, for example. The most preferred purge gas is pure methane. A bottle of methane 104 according to the preferred method is fluidly connected to the reaction chamber 80 and supplies the purge gas.

To begin the purging process, the reaction chamber is evacuated to between about 400 and about 500 millitorr. The gas supply valve 100 is closed, and the outlet valve 92 is open during evacuation. A vacuum pump 94 removes gas from the reaction chamber 80. The purge gas valve 106 is then opened, and the reactive gas is allowed to enter the reaction chamber 80. The reactive gas supply valve 100 and the argon supply valve 90 remain closed during this step. Power to the anode 82 and cathode 84 is shut off. However, the cathode may remain energized. It is believed that the purging step is mainly a diffusion step, and the presence of glow discharge is not necessary to cause the fluorine-containing radicals to diffuse.

The vacuum pump 94 maintains a vacuum of approximately 400 millitorr while the purge gas is passing through the chamber 80. By purging the chamber 80, the purge gas contacts the surface of the carriage 10, and consumes any available reactive fluorine radicals. Fluorinated hydrocarbon gasses are purged out of the chamber 80, and the surface energy of the resulting coating is substantially reduced. It is believed that this step does not add additional thickness to the coating, and does not alter the composition of the coating.

A fluorinated hydrocarbon coating having the composition shown above, and having a thickness between about 50 and about 500 angstroms on the average has about 12 molecular layers. If the composition of the coating is altered slightly by the purging step, only the outermost molecular layer is chemically changed. The remaining layers of molecules are substantially of the formula provided above. It is possible that a very small percentage of the reacted fluorine atoms in the outermost layer of the coating would be replaced with hydrogen atoms.

The carriage 12 is exposed to a purge gas for a period of between about ten and about 15 minutes. The minimum exposure time is about ten minutes, and an exposure time of about 15 minutes is preferred.

The resulting coating formed on the exposed surfaces of the carriage 10 has a very low surface energy, which has a very low reactivity to many substances. In particular, the coating of the present invention is substantially resistant to water, and many contaminants in the atmosphere such as chlorine and oxygen, which rapidly react with magnesium. The coating of the present invention is also very tough, scratch-resistant and smooth.

Although the present invention has been described with reference to preferred embodiments, workers skilled in the art will recognize that changes may be made in form and detail without departing from the spirit and scope of the invention.

What is claimed is:

1. An actuator arm carriage for supporting an actuator arm in a magnetic disk drive, the actuator arm carriage comprising:
a carriage body having a shaped exterior surface that is susceptible to corrosion, wherein the body is formed from a magnesium alloy in which magnesium is a principal component; and
a polymeric film consisting essentially of extended chain fluoropolymers in direct contact with and coating the exterior surface of the body, the film having a thickness sufficient to inhibit corrosion of the carriage body caused by reaction of magnesium with substances in an atmosphere surrounding the carriage.

2. The carriage of claim 1 wherein the magnesium alloy has a modulus of elasticity between about 6.0 million and about 12.0 million psi.

3. The carriage of claim 2 wherein the magnesium alloy includes zinc in an amount of about 1% by weight, aluminum in an amount 9% by weight, and manganese in an amount of about 0.2% by weight.

4. The carriage of claim 1 wherein the coating is a substantially saturated fluorocarbon polymer, having a C:F atomic ratio of about 1:2.

5. The carriage of claim 1 wherein the polymeric film is between about 50 and about 500 angstroms thick.

6. The carriage of claim 1 wherein the body is formed by a die cast method.

7. The carriage of claim 1 wherein the body is formed by a sand cast method.

8. A method of inhibiting corrosion of a shaped mechanical part having exterior surfaces which are formed from a magnesium metal alloy comprising the steps of:
positioning the part in a reaction chamber, the reaction chamber having an anode and a cathode;
providing a vacuum at an initial pressure between about 250 and about 300 millitorr;
forming a glow discharge plasma with a power supply to the anode and cathode of between about 100 and about 200 Watts, and at a frequency of about 13.6 megahertz;
introducing a reactive gas comprising fluorinated alkanes to the reaction chamber, wherein the gas pressure is maintained between about 100 to about 300 millitorr;
exposing the exterior surfaces to the reactive gas and plasma for an amount of time sufficient to form a polymeric film covering the exterior surfaces which are in direct contact with and formed from a magnesium metal alloy, the polymeric film consisting essentially of extended chain fluoropolymers; and exposing the exterior surfaces to a purge gas comprising at least one hydrocarbon for an amount of time sufficient to form a coating capable of protecting the mechanical part from atmospheric corrosion.

9. The method of claim 8 and further comprising the step of providing an argon atmosphere at a pressure of between about 250 and about 300 millitorr prior to introducing the reactive gas.

10. The method of claim 8 wherein the shaped mechanical part contacts the cathode while the part is being exposed to the reactive gas.

11. The method of claim 10, wherein the shaped mechanical part is inductively coupled to the cathode.

12. The method of claim 8, wherein the shaped mechanical part is out of physical contact with the anode and cathode, and the part is positioned substantially between the anode and cathode.

13. The method of claim 8 wherein power is supplied at about 150 watts.

14. The method of claim 8 wherein the exterior surfaces are exposed to the reactive gas for between about 45 minutes and about 2 hours.

15. The method of claim 14 wherein the surfaces are exposed for about an hour.

16. The method of claim 8 wherein the pressure in the chamber is at about 250 millitorr pressure when the part is being exposed to the reactive gas.

17. The method of claim 8 wherein the fluorinated alkane is $CF_4$.

18. The method of claim 8 wherein the reactive gas is a mixture of $CF_4$ and $F_2$.

19. The method of claim 8 and further comprising the step of exposing the part to an argon glow discharge plasma prior to exposing the exterior surfaces to the reactive gas for between about 45 minutes and about 2 hours for cleaning the outer surfaces.

20. The product of the process of claim 8.

21. The product of claim 20, wherein the coating thickness is between about 50 and about 500 angstroms.

22. The method of claim 8 wherein a pressure sensor and pressure controller maintain a selected pressure in the chamber.

23. The method of claim 8 wherein prior to positioning the part in the reaction chamber, the exterior surfaces are coated with machine oil immediately after forming the part to inhibit environmental corrosion.

24. The method of claim 23 wherein after contacting the exterior surfaces with oil, the part is washed in an ultrasonic bath containing a solvent, for removing all but trace amounts of machine oil.

25. The method of claim 8 wherein the fluorinated alkane is carbon tetrafluoride.

26. The method of claim 8 wherein the ratio of carbon atoms to fluorine atoms in the reactive gas is less than or equal to about one carbon atom per two fluorine atoms.

27. The method of claim 8 wherein the magnesium containing part is formed from Alloy AZ91B.

28. The method of claim 8 wherein the magnesium containing part is formed from Alloy AZ31B.

29. The method of claim 8 wherein the purge gas is methane.

30. The method of claim 8 wherein after the coating is formed, the power to the electrodes is shut off, and a vacuum between about 400 and about 500 millitorr is provided before introduction of the purge gas.

31. The method of claim 29 wherein a pressure of about 400 millitorr is maintained for a period of between about ten and about fifteen minutes during the purging step.

* * * * *

UNITED STATES PATENT AND TRADEMARK OFFICE
CERTIFICATE OF CORRECTION

PATENT NO. : 5,156,919
DATED : October 20, 1992
INVENTOR(S) : AMARJIT S. BRAR, PRATIVADI B. NARAYAN It is certified that error appears in the above-identified patent and that said Letters Patent is hereby corrected as shown below:

ON THE TITLE PAGE:

Delete (73) Assignee: Segate Technology, Inc., Scotts Valley, Calif.

Insert (73) Assignee: Seagate Technology, Inc., Scotts Valley, Calif.

Signed and Sealed this

Twelfth Day of October, 1993

Attest:

BRUCE LEHMAN

*Attesting Officer*  *Commissioner of Patents and Trademarks*